United States Patent [19]

Stone

[11] Patent Number: 5,206,647
[45] Date of Patent: Apr. 27, 1993

[54] LOW COST AGC FUNCTION FOR MULTIPLE APPROXIMATION A/D CONVERTERS

[75] Inventor: Wade J. Stone, Los Angeles, Calif.

[73] Assignee: Hughes Aircraft Company, Los Angeles, Calif.

[21] Appl. No.: 722,763

[22] Filed: Jun. 27, 1991

[51] Int. Cl.[5] .............................................. H03M 1/18
[52] U.S. Cl. .................................... 341/139; 341/156
[58] Field of Search ............... 341/139, 156, 161, 162, 341/163

[56] References Cited

U.S. PATENT DOCUMENTS

| | | | |
|---|---|---|---|
| 3,956,746 | 5/1976 | Lisle, Jr. et al. | 341/127 |
| 4,611,342 | 9/1986 | Miller et al. | 381/36 |
| 4,734,677 | 3/1988 | Cake et al. | 341/122 |
| 4,792,787 | 12/1988 | Speiser et al. | 341/156 |
| 4,811,018 | 3/1989 | Sakata | 341/139 |
| 4,851,842 | 7/1989 | Iwamatsu | 341/139 |
| 4,875,048 | 10/1989 | Shimizu et al. | 341/156 |
| 4,896,155 | 1/1990 | Craiglow | 341/120 |

Primary Examiner—Marc Hoff
Attorney, Agent, or Firm—L. A. Alkov; W. K. Denson-Low

[57] ABSTRACT

An automatically gain controlled multiple approximation analog to digital converter including a gain controlled amplifier responsive to the difference between an analog input signal and an analog version of a digital approximation of the analog input signal for providing a gain controlled analog residue signal, a quantizer for converting the gain controlled analog residue signal to a gain controlled digital residue signal, a digital divide circuit for dividing the gain controlled digital residue signal by a factor representative of the gain contained therein to provide a restored digital residue signal representative of the analog residue signal before it was amplified by the gain controlled amplifier, and a summing circuit for adding the restored digital residue signal and the digital approximation to provide the output of the gain controlled analog to digital converter. The gain controlled amplifier and the divide circuit are controlled by a gain control circuit that tends to maintain the output of the quantizer between first and second thresholds. Circuitry for providing the digital approximation of the analog input signal can include a linear predictor, or a sample and hold circuit and a coarse quantizer, for example.

9 Claims, 2 Drawing Sheets

LOW COST AGC FUNCTION FOR MULTIPLE APPROXIMATION A/D CONVERTERS

BACKGROUND OF THE INVENTION

The subject invention is directed generally to multiple approximation analog-to-digital converters (ADCs), and is directed more particularly to an automatically gain controlled multiple approximation ADC with automatic gain control (AGC) and gain controlled amplifier (GCA) functions implemented in the feedback or feed forward loop or loops of the multiple approximation ADC. Multiple approximation ADCs are also referred to as sub-ranging ADCs, multiple pass ADCs, and successive approximation ADCs.

ADCs are utilized in digital signal processing systems wherein an analog signal is converted to a digital signal for further processing. For example, ADCs are utilized in radio frequency receivers such as broadcast radio receivers, radar receivers, and the like.

In radio frequency receiver applications of ADCs, gain controlled amplifiers (GCA's) are used prior to analog to digital conversion in order to minimize the signal to noise ratio (SNR) degradation caused by the analog to digital conversion process. The output SNR degradation in an ADC drops proportionally to the input signal power, so it is optimal to have the input signal power be as large as possible. On the other hand, the ADC is also a clipper, meaning that it has a maximum input signal range prior to clipping, after which SNR degrades drastically. Therefore, AGC amplification is used to optimize SNR.

Considerations with gain controlled amplifiers include AGC loop instability due to loop delays and gain; inadequate AGC attack speed, in reference to how fast the AGC can track a dynamic input signal, which can result in suboptimal SNR results; and suboptimal GCA linearity for some gain settings, since optimization can generally be performed over some given gain range.

A linear predictive coding ADC is a form of a multiple approximation ADC which has been proposed in an effort to overcome dynamic range limitations. See, for example, "Developments in Techniques for Enhancing The Dynamic Range of Analog to Digital Converters," McKnight et al., Proc. of ICASSP 1988, pages 1742–1745, which is directed to an implementation technique of a bandlimited predictor that provides improved performance in the presence of quantizing noise.

An important consideration with the LPC ADC discussed by McKnight, et al. is the potential for loop instability. The loop can be driven into undesirable limit-cycle oscillations (LCO's) under some conditions. An LCO is seen as a toggling between maximum positive full scale output and maximum negative full scale output which is sustained until the LPC ADC is subjected to a reset sequence, wherein the input is significantly reduced in power and the predictor is zeroed wherein all memory is erased. The cause for the LCO is two-fold: 1) the inability of the predictor to predict the next sample with enough accuracy due to excessive input signal slew rate, such that the error voltage at the summing amplifier causes the internal quantizer to clip; and 2) the input signal amplitude exceeds the maximum full-scale range of the digital-to-analog converter (DAC) which converts the digital prediction value to analog. This latter also causes clipping from the DAC, which results in unacceptable error at the quantizer input causing further clipping and hence LCO.

SUMMARY OF THE INVENTION

It would therefore be an advantage to provide a stable automatic gain controlled multiple approximation A/D converter having improved signal to noise ratio performance.

The foregoing and other advantages are provided by the invention in an automatically gain controlled A/D converter that includes a gain controlled amplifier responsive to the difference between an analog input signal and an analog version of a digital approximation of the analog input signal for providing a gain controlled analog residue signal, a quantizer for converting the gain controlled analog residue signal to a gain controlled digital residue signal, a digital divide circuit for restoring the level of the gain controlled digital residue signal to represent the level of the analog residue signal before it was amplified by the gain controlled amplifier, and a summing circuit for adding the restored digital residue signal and the digital approximation to provide the output of the gain controlled analog to digital converter. The gain controlled amplifier and the divide circuit are controlled by a gain control circuit that tends to maintain the output of the quantizer between first and second thresholds. Circuitry for providing the digital approximation of the analog input signal can include a linear predictor, or a sample and hold circuit and a coarse quantizer, for example.

BRIEF DESCRIPTION OF THE DRAWINGS

The advantages and features of the disclosed invention will readily be appreciated by persons skilled in the art from the following detailed description when read in conjunction with the drawings wherein.

DETAILED DESCRIPTION OF THE DISCLOSURE

Figure 1:
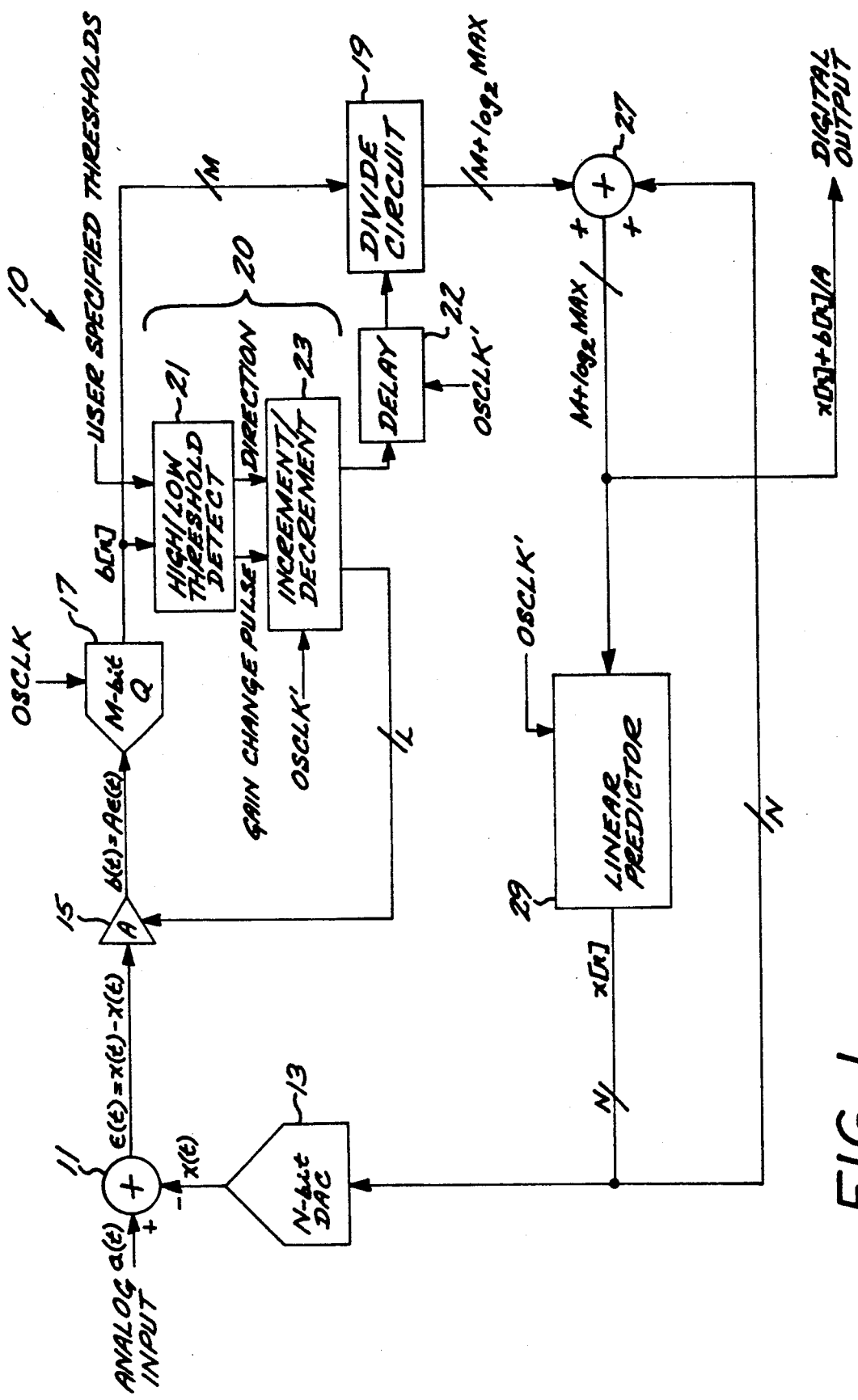
FIG. 1 is a block diagram of an automatically gain controlled multiple approximation analog-to-digital converter in accordance with the invention which includes a linear predictor for providing the coarse digital approximation of the analog input signal.

In the following detailed description and in the several figures of the drawing, like elements are identified with like reference numerals.

Referring now to FIG. 1, shown therein by way of illustrative example is a block diagram of a linear predictive analog to digital converter 10 that includes internal automatic gain control (AGC) in accordance with the invention. The linear predictive analog to digital converter 10 includes a subtraction circuit 11 that receives a bandlimited analog input signal a(t) and subtracts therefrom an analog signal x(t) which is a coarse approximation of the input analog signal a(t). The analog coarse approximation signal x(t) is provided by a digital to analog converter 13 which converts the digital coarse approximation output of a linear predictor 29, which for example can be transversal linear predictor.

The subtraction circuit output $\epsilon(t)$ can be expressed as follows:

$$\epsilon(t) = a(t) - x(t) \qquad \text{(Equation 1)}$$

The output of the subtraction circuit 11 represents the error or residue between the coarse approximation value and the analog input signal, and is amplified by a gain controlled amplifier (GCA) 15 having a dynamic gain A to provide a gain controlled analog output b(t) which can be expressed as follows:

$$b(t) = A\epsilon(t) \qquad \text{(Equation 2)}$$

The gain A of the GCA 15 is set by a gain/division control circuit 20 as more fully described herein.

An M-bit quantizer 17 converts the output of the GCA 15 to provide an M-bit wide quantized amplified error signal b[n], wherein n refers to the $n^{th}$ sample. The quantizer 17 is clooked with an oversamplinq clock signal OSCLK, and the linear predictor 29 is clocked with a delayed oversampling clock signal OSCLK' which has the same frequency as the oversampling clock OSCLK but is delayed relative thereto by a time which is smaller than the period T of the clock signals OSCLK and OSCLK'. These are oversampling clock signals in that their frequency is greater than the minimum sampling frequency that would be required for the frequency content of the input analog signal.

The M-bit quantizer output is utilized by the gain/-division control circuit 20 for adjusting the gain A of the AGC 15. It is noted that the gain setting of the AGC 15 is always one clock cycle behind the quantizer output utilized to arrive at the gain setting; i.e., the gain reflected in the $n^{th}$ sample b[n] is based on the amplitude of the prior quantizer sample output b[n−1]. With a bandlimited signal (such as is the case here) there is no problem with stability.

The quantized amplified error signal output b[n] of the quantizer 17 is provided to a digital divide circuit 19 which divides b[n] by the value A[n−1] to provide an output b[n]/A[n−1], where A[n−1] was the gain of the GCA 15 at the time the GCA amplified error signal was sampled by the quantizer. A delay circuit 22, which is clocked with the same clock signal OSCLK' as the linear predictor, is interposed between the gain/division control circuit and the divide circuit 19 to provide a one-clock delay so that 15 the quantizer output b[n] is divided by A[n−1].

It should be appreciated that the gain control and division control signals provided by the gain/division control circuit 20 pursuant to the quantizer sample b[n] can both comprise A[n], or the division control signal can comprise 1/A[n], depending upon implementation.

The output of the divide circuit 19 has a word width of (M+log$_2$MAX) where MAX is the maximum allowed value for A. The divisor to the digital divide circuit 19 is controlled by the gain/division control circuit 20 which, as described previously, also controls the gain of the GCA 15.

Essentially, the output of the subtraction circuit 11 is amplified by the GCA 15 by a factor of A[n−1] prior to quantizing. The quantizer sample output b[n] is then attenuated or de-amplified by substantially the same factor A[n−1] to restore the amplified quantized error value to its nominal value.

The restored quantized error value and the N-bit digital prediction value of the linear predictor 29 are added by a digital adder 27 to provide a high precision digital data sample DIGITAL OUTPUT:

$$\text{DIGITAL OUTPUT} = x[n] + b[n]/A \qquad \text{(Equation 3)}$$

The output of the digital adder 27 is also provided as an input to the linear predictor 29. As is well known, the linear predictor 29 extrapolates a future data sample from a predetermined number of samples including the present sample.

The divide circuit 19 and the adder 27 are implemented with combinatorial logic so that the $n^{th}$ sample provided at the output of the quantizer 17 is available for use by the linear predictor 29 for predicting the value of the $(n+1)^{th}$ sample. In this regard, the delay between the oversampling clocks OSCLK and OSCLK' is to allow for adequate conversion time for the quantizer 17 and the subsequent divide and summing functions prior to clocking of the linear predictor.

The maximum value MAX allowed for the value A for gain and subsequent attenuation should be equal to $2^N$, where N is the width of the prediotor output, which is based on the fact that the smallest possible probabilistic residue is the DAC LSB. The term probabilistic here refers to the fact that, assuming no prediction error for the moment, the minimum residue resulting from a Gaussian input signal of any given RMS power is spread indeterministically between −LSB/2 and +LSB/2. This implies that amplifying the residue by a value greater than MAX will always cause the M-bit quantizer output to clip probabilistically an unacceptable percentage of samples.

The gain/division control circuit 20 functions to maintain the level of the GCA input to the quantizer 17 within a range that is optimum for the operation of quantizer by monitoring the output of the quantizer and adjusting the gain of the GCA 15.

By way of illustrative example, the gain/division control circuit 20 is implemented with a high/low threshold detect circuit 21 which provides a gain change enable pulse and a gain change direction signal to an increment/decrement circuit 23 which is clocked with the same oversampling clock signal OSCLK' as the linear predictor. The threshold detect circuit 21 examines the quantizer output and determines whether the GCA output signal level, as represented by the quantizer output, is between a user specified high threshold and a user specified low threshold. Thus, if a particular sample exceeds the high threshold, the threshold detect circuit 21 provides a gain change enable pulse and a gain change direction signal indicating that the gain should be reduced. If a particular sample drops below the low threshold, the threshold detect circuit 21 provides a gain change enable pulse and a qain change direction signal indicating that the gain should be increased. Pursuant to a gain change pulse, the increment/decrement circuit 23 increments or decrements the gain in the direction specified by the gain change direction signal (i.e., up or down) by a user specified value. By way of illustrative example, the increment/decrement circuit can comprise a bidirectional counter.

An integration function may be implemented in the threshold detect circuit 21 for the AGC function if certain considerations are made. The AGC will be unstable if the integration lag is too great for the rate of change of the signal relative to the oversampling frequency. So the integration time constant (i.e., the number of accumulated samples) is an important design parameter which is limited by stability. The integration can be implemented by way of illustrative example as an absolute mean average in accordance with the following equation:

$$\text{A.M.} = (1/N) \sum_{n=n_1}^{N+n-1} |b[n]| \quad \text{(Equation 4)}$$

where A.M. is "absolute mean", b[n] is the output of the quantizer, $n_1$ is the integration start sample instant, and N is the number of integrated samples. This integration would tend to bandlimit the effect of the threshold function within the AGC function to slow the track time, which is its intended purpose.

It should be appreciated that as to implementation, simplification as to the threshold circuit 20 and the divide circuit 19 can be achieved by implementing the gain value A as a power of 2 (i.e., $A=2^k$ where k is an integer), in which case the divide circuit 19 could be implemented as a demultiplexing circuit which would effectively shift the output of the quantizer to the right by k bits relative to some nominal gain setting established by the designer, and the gain control circuit 20 would comprise a bidirectional shift register whose contents would be a 1 with the remaining bits being 0's. If the gain A of the GCA needed to be increased, the shift register would be shifted right; and if the gain A needed to be decreased, the shift register would be shifted left.

The AGC linear predictive analog-to-digital converter 10 of FIG. 1 generally operates as follows. A clock pulse incident upon the clock input of the predictor causes the valid data at the input to be clocked into the predictor. The predictor uses this value, x[n], and L past values in the following mathematical operation to extrapolate the next sample value, x[n+1]:

$$y[n] \approx x[n+1] \approx \sum_{i=1}^{L} h[i] \cdot x[n-i+1] \quad \text{(Equation 5)}$$

where h[i] are the L coefficients of the linear predictor. The coefficients may be quantized to some nominal precisions, or may be floating point values. After some small (relative to the period T of OSCLK') time following the clock pulse, the predicted value (which may be itself quantized to some precision, usually to that of the input to the DAC 13) is available at the output of the predictor and is provided along two paths. The predictor output is provided as the input to an N bit DAC for conversion to an analog voltage or current as appropriate to the implementation. That resultant analog version of the predicted value is then subtracted from the analog input signal. It is necessary that the analog input signal has been bandlimited to some nominal bandwidth, which the design has taken into consideration while designing the predictor coefficients. The result of the subtraction, which is the prediction error, is amplified by the GCA 15 pursuant to its gain A. The gain A has been calculated on the previous sample, by comparing the output of the M-bit quantizer 17 with some user specified high and low thresholds. If the output level of the quantizer 17 is too small (i.e., a sample or the average of several samples is below the low threshold), then the counter is incremented by a user specified value in the most general case, or increased by a power of 2 (i.e., the MSB of the "counter" is shifted left) in the $A=2^k$ case. Likewise, the opposite is true when the quantizer output signal level is too large (i.e., a sample or the average of several samples is above the threshold). No count or shift takes place when the signal level is between the high and low thresholds.

The amplified predictor error is fed to the input of the M-bit quantizer, where it is converted from analog to digital. As described earlier, the quantizer clock OSCLK occurs after the predictor clock OSCLK' by some time which is smaller than the AGC LPC A/D oversample period T (i.e., the common period of the clock signals OSCLK and OSCLK') so that adequate conversion time is given the M-bit quantizer and the subsequent functions, prior the completing the loop. Following the M-bit quantizer, the converted, amplified prediction error is fed to the divide-by-A function, which essentially de-amplifies the error back to its pre-gain level. Functionally, the amplification has been provided by the GCA in order to fully utilize the maximum dynamic range provided by the M-bit quantizer.

The output of the divide circuit is then provided to the digital adder which sums it with the predictor output x[n], which has been static as the output of the predictor. The output of this summation is both the next input to the predictor, and the digital sample representing the analog input signal at the next predictor clock time. Thus, the analog input signal has been converted to digital signal wherein the $n^{th}$ sample has a precision of $M+\log_2 A[n-1]$.

The LPC analog to digital converter incorporating the invention provides the advantage of eliminating or enhancing an AGC function that is external to the predictor loop, which can be better appreciated from the following analysis. The quantization distortion level relative to the LPC analog to digital converter full-scale voltage range is proportional, in dB, to $M+\log_2 A[n-1]$, where $A[n-1]$ is the gain applied to the input signal that resulted in the quantizer output sample b[n]. The predictor has a frequency dependent gain, whereby the prediction transfer function is never exactly 0 dB, but in fact ripples about 0 dB in the passband of the predictor. This constitutes a gain error at the nominal signal frequency. Since the output of the LPC analog to digital converter is a very close digital approximation to the analog input signal, and is also the input to the predictor, then the output of the predictor has a gain error with respect to the input signal. This further means that the residue signal contains a gain error term, in addition to the DAC quantization error. For example, assume no DAC quantization error and a sinusoidal input signal with amplitude C: $x(t)=C\sin\Omega_c t$. Then assume the predictor has gain error $\partial(\Omega_c)$ so that it puts out a value that is $C[1\partial(\Omega_c)]\sin\Omega_c t$. Then the residue is just $C\partial(\Omega_c)\sin\Omega_c t$. Therefore, the residue amplitude is proportional to the input amplitude. Let us assume that there is no AGC in front of the LP analog to digital converter and that the summing amplifier gain A is static. If C is smaller than full-scale, then $\partial(\Omega_c)CA$ is smaller than the expected worst case full-scale amplified residue (since A is used to optimally load the quantizer), and the quantization distortion due to the quantizer is relatively large compared to the residue. This is added (after division by A) to the prediction value and we have SNR proportional to $M+\log_2 A$. In accordance with the invention, A is made to be dependent upon residue amplitude and therefore dependent upon input signal amplitude, so that $M+\log_2 A$ is dependent upon input signal amplitude. This is the same functionality as placement of an AGC in front of the LPC A/D (if there is too small a ripple value at some important frequency to provide a signal amplitude proportional residue, then a predictor gain error can be incorporated). Thus, a major advantage provided by the invention is an automatic internal gain optimization function that eliminates or enhances a front-end external AGC function.

Figure 2:
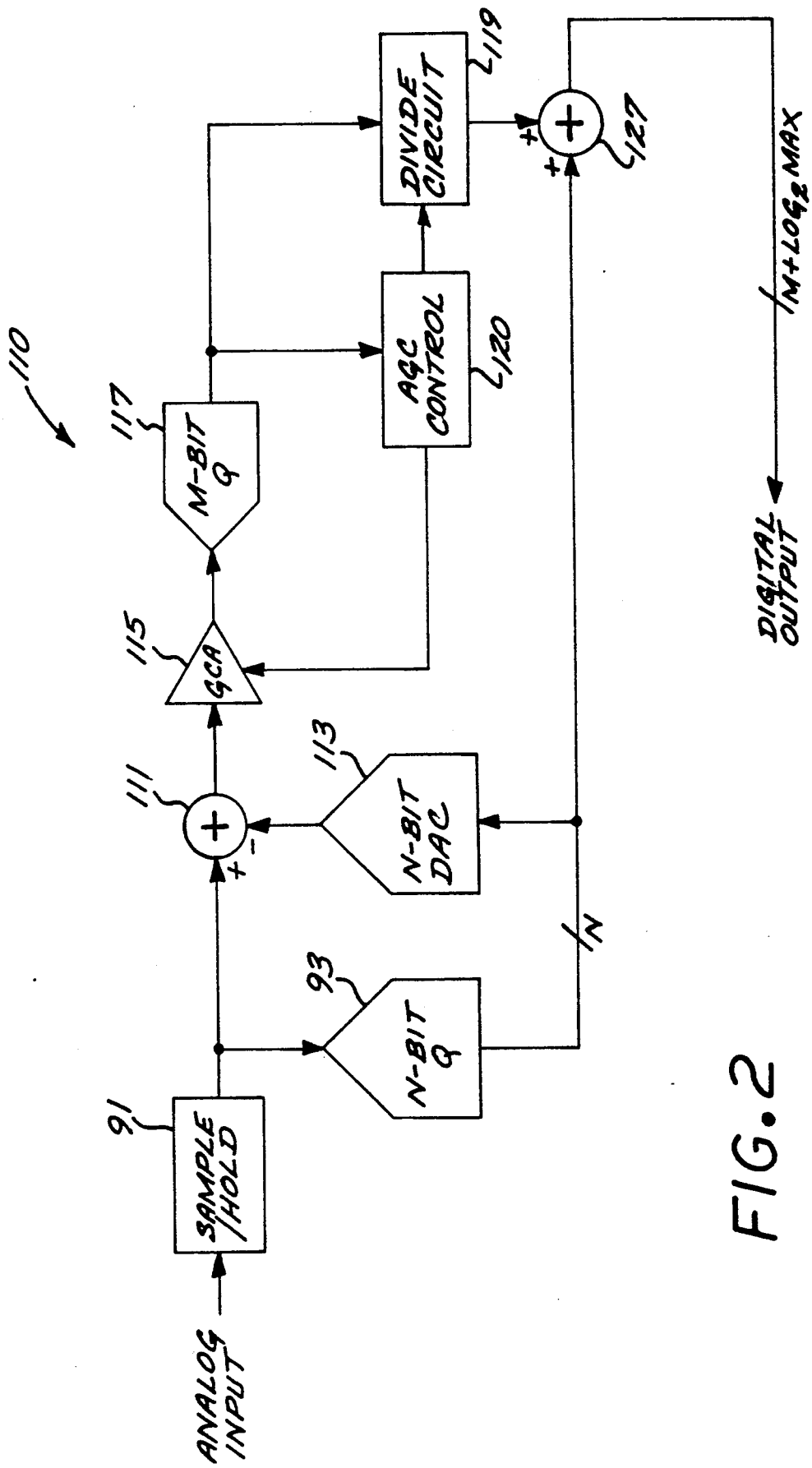
FIG. 2 is a block diagram of an automatically gain controlled multiple approximation analog-to-digital converter in accordance with the invention which includes a sample and hold circuit and a coarse quantizer for providing the digital approximation of the analog input signal.

Referring now to FIG. 2, set forth therein by way of further illustrative example is a block diagram of a further multiple approximation analog to digital converter 110 that includes internal AGC in accordance with the invention. The analog to digital converter 110 includes a sample and hold circuit 91 whose output is provided to an N-bit "coarse" quantizer 93 and as one input to a substraction circuit 111. The other input to the subtraction circuit 111 is provided by an N-bit DAC 113 whose input is provided by the coarse quantizer 93. The output of the subtraction circuit is the residue or error between the input analog signal as held by the sample and hold circuit 91 and the coarse approximation thereof as provided by the coarse quantizer 93.

The output of the subtraction circuit is amplified by a GCA 115 having a dynamic gain A which is controlled by a gain/division control circuit 120. An M-bit "fine" quantizer 117 converts the output of the GCA 115 to provide an M-bit wide quantized amplified error signal b[n].

The quantized amplified error signal provided by the quantizer 117 is provided to a digital divide circuit which divides the output of the quantizer 117 by the value A of the gain provided by the GCA 115 at the time its output was sampled to produce the sample b[n]. The output of the divide circuit 119 is added with the output of the coarse quantizer 93 to provide the digital output of the analog to digital converter of the FIG. 2.

The operation of the GCA 115, the M-bit quantizer 117, the gain control circuit 120, the delay circuit 122, and the divide circuit is substantially similar to the operation of corresponding components in the linear predictive A/D converter 10 of FIG. 1.

The multiple approximation feedforward analog to digital converter 110 of FIG. 2 generally operates as follows. The coarse quantizer generates an initial coarse approximation of the input signal that is being held by the sample and hold circuit which is matched to the delay of the initial approximation path. An analog version of the coarse approximation is subtracted from the held input signal to produce a residue which is then amplified by the GCA to fully load the fine quantizer. The quantized amplified residue is then de-amplified by the same factor as used for amplification to generate a digitized residue that is at its nominal amplitude relative to the input signal power. The restored digital residue is then added to the coarse approximation to form a high resolution digital sample of the analog input.

The inclusion of the AGC function on the residue amplifier within the feedforward structure serves the same purpose as for a feedback structure such as the LPC above. The SNR of the overall A/D is optimized by tracking the gain error of the coarse approximation from the residue which equalizes the input power to the fine quantizer. In general, the invention is applicable to any A/D conversion system which makes an initial digital approximation to the input analog signal, then converts the approximation back to analog and subtract, creating an analog residue of the approximation. In accordance with the invention, the analog residue signal is subjected to gain controlled amplification to optimize the operation of a quantizer that converts the amplified residue to digital. The digital amplified residue is then de-amplified to produce a restored digital residue that is combined with the digital approximation of the analog input signal to produce a high resolution sample.

Although the foregoing has been a description and illustration of specific embodiments of the invention, various modifications and changes thereto can be made by persons skilled in the art without departing from the scope and spirit of the invention as defined by the following claims.

What is claimed is:

1. An automatically gain controlled analog to digital converter for converting a bandlimited analog input signal to a digital output signal, comprising:
   linear predictive approximating means for providing a digital approximation of the bandlimited analog input signal;
   digital to analog conversion means responsive to said digital approximation for providing an analog approximation of the bandlimited analog input signal;
   analog subtraction means for subtracting said analog approximation from the bandlimited input analog signal to provide an analog residue signal;
   analog amplitude adjusting means responsive to said analog subtraction means for providing an amplitude adjusted analog residue signal;
   quantizing means for converting said amplitude adjusted analog residue signal to an amplitude adjusted digital residue signal;
   control means responsive to said amplitude adjusted digital residue signal for controlling said analog amplitude adjusting means so that the amplitude of said amplitude adjusted analog residue signal is optimized for the operation of said analog to digital conversion means;
   digital amplitude restoring means responsive to said control means and said gain controlled digital residue signal for removing the amplitude adjustment provided by said analog amplitude adjusting means to provide an amplitude restored digital residue signal; and
   digital summing means for summing said amplitude restored digital residue signal and said digital approximation to provide the digital output of the analog to digital converter and the input to said linear predictive approximating means;
   whereby optimization of the amplitude of said amplitude adjusted analog residue signal avoids loop instability of the analog to digital converter.

2. The automatically gain controlled analog to digital converter of claim 1 wherein said analog amplitude adjusting means comprises a gain controlled amplifier, and wherein said amplitude restoring means comprises means for dividing said amplitude adjusted digital residue signal by a factor representative of the gain controlled amplifier gain included in the amplitude adjusted analog residue signal that resulted in the amplitude adjusted digital residue signal.

3. The automatically gain controlled analog to digital converter of claim 2 wherein said control means controls the gain of said gain controlled amplifier such that the output of said analog to digital conversion means tends to remain within specified high and low thresholds.

4. The automatically gain controlled analog to digital converter of claim 1 wherein said analog amplitude adjusting means comprises a gain controlled amplifier, and wherein said amplitude restoring means comprises means for dividing said amplitude adjusted digital residue signal by a factor representative of the gain controlled amplifier gain included in the amplitude adjusted analog residue signal that resulted in the amplitude adjusted digital residue signal.

5. The automatically gain controlled analog to digital converter of claim 4 wherein said control means controls the gain of said gain controlled amplifier such that the output of said analog to digital conversion means tends to remain within specified high and low thresholds.

6. The automatically gain controlled analog to digital converter of claim 1 wherein said analog amplitude adjusting means comprises a gain controlled amplifier, and wherein said amplitude restoring means comprises means for dividing said amplitude adjusted digital residue signal by a factor representative of the gain controlled amplifier gain included in the amplitude adjusted analog residue signal that resulted in the amplitude adjusted digital residue signal.

7. The automatically gain controlled analog to digital converter of claim 6 wherein said control means controls the gain of said gain controlled amplifier such that the output of said analog to digital conversion means tends to remain within specified high and low thresholds.

8. An automatically gain controlled linear predictive analog to digital converter for converting bandlimited analog input signal to a digital output signal, comprising:
- a linear predictor circuit for providing a digital predictor output;
- a digital to analog converter responsive to said digital predictor output for providing an analog predictor output;
- analog subtraction means for subtracting said analog predictor signal from the bandlimited input analog signal to provide an analog residue signal;
- gain controlled amplifier means responsive to said analog subtraction means for providing a gain controlled analog residue signal;
- quantizing means for converting said gain controlled analog residue signal to a gain controlled digital residue signal;
- control means responsive to said gain controlled digital residue signal for controlling said gain controlled amplifier means so that the amplitude of said gain controlled analog residue signal tends to remain between a high threshold and a low threshold;
- dividing means responsive to said control means and said gain controlled digital residue signal for dividing said amplitude adjusted digital residue signal by a factor representative of the gain of the gain controlled analog residue signal that resulted in the gain controlled digital residue signal to provide a restored digital residue signal; and
- digital summing means for summing said restored digital residue signal and said digital predictor output to provide the digital output of the linear predictive analog to digital converter, said digital output being further provided as the input to said linear predictor;
- whereby controlo f the amplitude of aid gain controlled analog residue signal avoids loop instability of the analog to digital converter.

9. An automatically gain controlled analog to digital converter for converting a bandlimited analog input signal to a digital output signal, comprising:
- approximating means for providing a digital approximation of the bandlimited analog input signal wherein the digital approximation is based on prior output samples of the digital output signal of the converter;
- digital to analog conversion means responsive to said digital approximation for providing an analog approximation of the bandlimited analog input signal;
- analog subtraction means for subtracting said analog approximation from the bandlimtied input analog signal to provide an analog residue signal;
- analog amplitude adjusting means responsive to said analog subtraction means for providing an amplitude adjusted analog residue signal;
- quantizing means for converting said amplitude adjusted analog residue signal to an amplitude adjusted digital residue signal;
- control means responsive to said amplitude adjusted digital residue signal for controlling said analog amplitude adjusting means so that the amplitude of said amplitude adjusted analog residue signal is optimized for the operation of said analog to digital conversion means;
- digital amplitude restoring means responsive to said control means and said gain controlled digital residue signal for removing the amplitude adjustment provided by said analog amplitude adjusting means to provide an amplitude restored digital residue signal; and
- digital summing means for summing said amplitude restored digital residue signal and said digital approximation to provide the digital output of the analog to digital converter and the input to said linear predictive approximating means;
- whereby optimization of the amplitude of said amplitude adjusted analog residue signal avoids loop instability of the analog to digital converter.

* * * * *